United States Patent [19]
Jokura

[11] Patent Number: 5,270,669
[45] Date of Patent: Dec. 14, 1993

[54] LOCAL OSCILLATING FREQUENCY SYNTHESIZER FOR USE IN A TDMA SYSTEM

[75] Inventor: Jun Jokura, Tokyo, Japan

[73] Assignee: NEC Corporation, Japan

[21] Appl. No.: 923,854

[22] Filed: Jul. 31, 1992

[30] Foreign Application Priority Data

Jul. 31, 1991 [JP] Japan ............... 3-190431

[51] Int. Cl.$^5$ .................................. H03L 7/07
[52] U.S. Cl. ............................... 331/2; 331/25; 331/49; 328/14; 455/76; 455/183.1; 455/260
[58] Field of Search ............ 331/2, 25, 49; 328/14; 455/76, 183.1, 183.2, 260

[56] References Cited

U.S. PATENT DOCUMENTS 4,086,544 4/1978 Fried ..................... 331/1 A
4,659,999 4/1987 Motoyama et al. ......... 331/49

FOREIGN PATENT DOCUMENTS 296311 12/1988 European Pat. Off. .
318033 5/1989 European Pat. Off. .
324508 7/1989 European Pat. Off. .

*Primary Examiner*—Siegfried H. Grimm
*Attorney, Agent, or Firm*—Ostrolenk, Faber, Gerb & Soffen

[57] ABSTRACT

A local oscillating frequency synthesizer includes a pair of synthesizers, one being used for synchronizing the frequencies of the communication channels used for the transmission and reception slots, and the other for synchronizing the frequencies when the electric field level of the other station is monitored and information is read out between idle slots other than the transmission and reception slots. Therefore, without using a high speed frequency switching synthesizer such as a direct digital synthesizer or the like, the synchronization of the frequencies by switching can be achieved in a short period of time and a local oscillating portion which is low in power consumption can be obtained.

3 Claims, 2 Drawing Sheets

LOCAL OSCILLATING FREQUENCY SYNTHESIZER FOR USE IN A TDMA SYSTEM

BACKGROUND OF THE INVENTION

The present invention relates to a TDMA (Time Division Multi-Access) system and, in particular, to a local oscillating frequency synthesizer of TDMA system for monitoring by idle slots.

In a local oscillating portion of the mobile communication terminal, which is used in the TDMA system, as a high speed switching frequency synthesizer for, subsequent to a transmission slot and reception slots, switching the frequency to observe the electric field and BER (Bit Error Ratio) of other adjacent station, a direct digital synthesizer have conventionally been used.

FIG. 1 is block diagram showing a prior art frequency synthesizer using a direct digital synthesizer 27. The frequency synthesizer includes a PLL (Phase-Locked Loop) frequency synthesizer comprising a voltage control oscillator (VCO) 19, a buffer amplifier 20, a fixed frequency divider 21, a phase comparator 22, a charge pump (CP) 23 and a low-pass filter (LPF) 24. The frequency synthesizer further comprises a low-pass filter (LPF) 25, a D/A (Digital-to-Analog) converter 26 and a reference oscillator 28.

In the direct digital synthesizer 27, a reference frequency is digitally generated by using an oscillating frequency from the reference oscillator 28, and after passed through the D/A converter 26 and the LPF 25, it is entered to the phase comparator 22 of the PLL synthesizer. On the other hand, the output frequency of the voltage control oscillator (VCO) 19 is divided by the fixed frequency divider 21 to be entered to the phase comparator 22 where it is compared in phase with the reference frequency. The resulting error signal is converted into a voltage corresponding to the phase difference between the compared frequencies by the charge pump (C.P.) 23 and the LPF 24 to control the oscillating frequency of the voltage control oscillator 22 to generate a carrier.

Communication channel (CH) designation data 4 are entered to the direct digital synthesizer 27 to change the reference frequency. As a result, even if the channels are switched at an interval of 25 KHz, the compared frequency at the phase comparator 22 can be set high to allow a high speed frequency switching.

FIG. 2 illustrates how the slots are disposed in the TDMA system, in which it is possible to read the monitoring information on the electric field level of the other base station by utilizing an idle period 31 of time other than the reception slot 29 and the transmission slot 30. In this case, the following will become necessary: by entering channel designation data 5 of the other station to be monitored to the direct digital synthesizer 27, subsequent to the transmission and reception slots, the oscillating frequency 32 is switched to other station's channel designated by the data 5 to monitor the electric field, BER and the like on the other station's channel, and at the next transmission and reception slots, the oscillating frequency is returned to the original communication channel. To this end, the above-described high speed frequency switching technique has been used.

In such a local oscillating frequency synthesizer using the conventional direct digital synthesizer as discussed above, in order to digitally generate the reference oscillating waveform, it is necessary to use the digital frequency generating portion and the D/A converter portion, which consumes the electric power greatly.

SUMMARY OF THE INVENTION

An object of the present invention is to provide a local oscillating frequency synthesizer for use in the TDMA system in which a digital frequency generating portion and a D/A converter portion are eliminated to reduce the power consumption by providing a dedicated frequency synthesizer of variable frequency dividing system which is used for frequency synchronization when the electric field, BTR and the like of the other adjacent station are observed in the idle slot.

According to the present invention, there is provided a local oscillating frequency synthesizer comprising:
- a first frequency synthesizer for synchronizing the frequencies of the communication channels used for transmission and reception slots;
- a second frequency synthesizer sharing a reference frequency oscillator with said first frequency synthesizer, for synchronizing the frequencies when the electric field level of a channel other than said communication channels is monitored and its information is read out of an idle slot other than said transmission and reception slots; and
- a selector means for selecting one of the outputs from said first and second frequency synthesizer.

In a preferred embodiment of the present invention, the frequencies for the communication channels using the transmission and reception slots are synchronized for transmission and reception by means of the communication channel frequency synthesizer of variable frequency dividing system, and when the electric field level of the channel other than the communication channels is monitored and its information is read out, the idle slots other than the transmission and reception slots are used for synchronizing the frequency of the other channel by means of the frequency synthesizer dedicated to monitoring the other channel, which shares the reference frequency oscillator with the communication channel frequency synthesizer. Therefore, without using the direct digital synthesizer, a local frequency synthesizer for monitoring other station which allows the frequency to be stably and fast switched while being low in power consumption can be obtained.

A preferred embodiment of the present invention will be described in detail with reference to the accompanying drawings.

DETAILED DESCRIPTION OF THE PREFERRED EMBODIMENT

Figure 3:
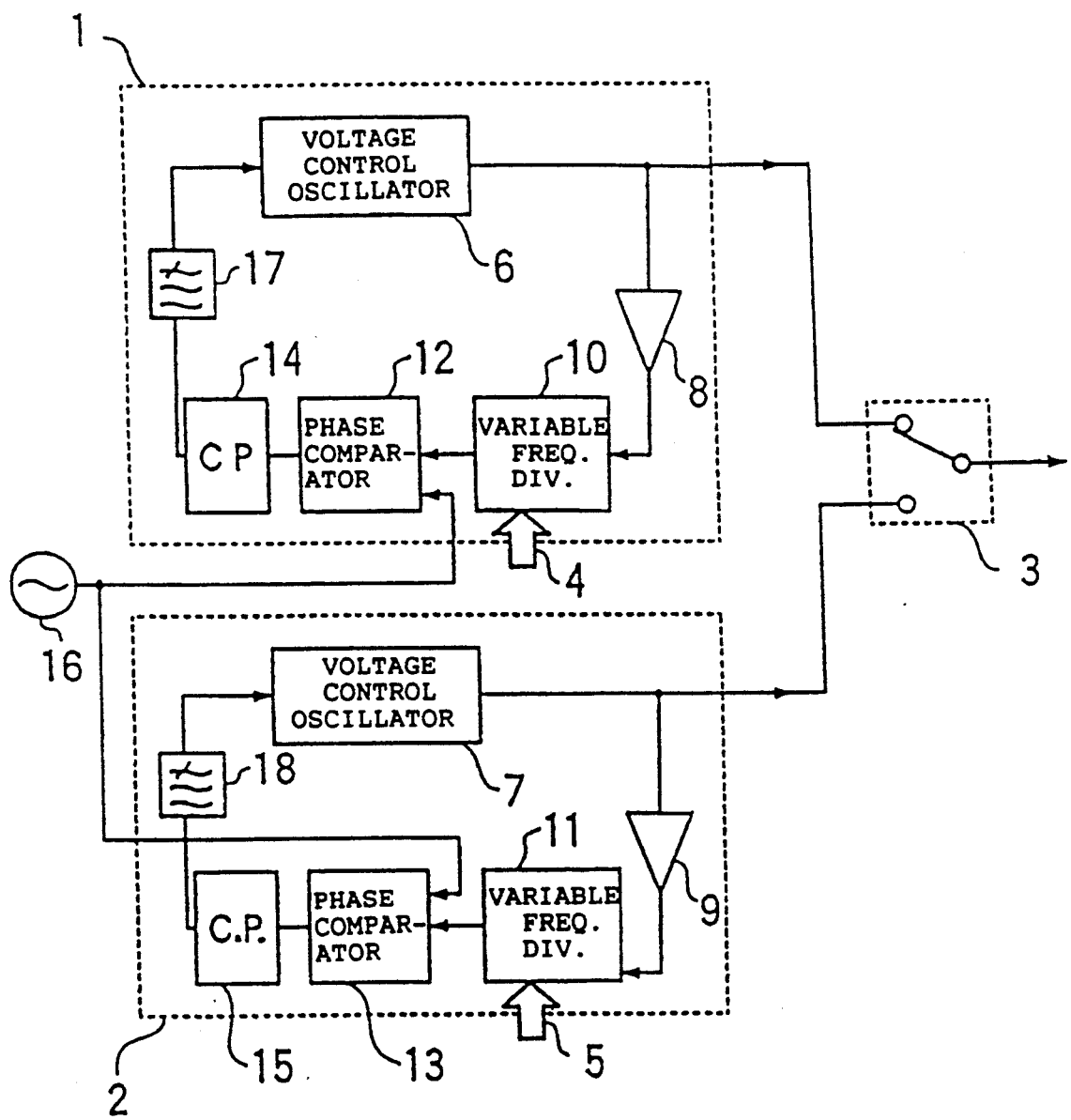
FIG. 3 is a block diagram of a local oscillating frequency synthesizer used in a TDMA system, which is according to a specific embodiment of the invention.

Referring to FIG. 3, there is illustrated a block diagram of a specific local oscillating frequency synthesizer embodying the present invention, which includes a first frequency synthesizer 1 used for synchronizing the frequencies of the communication channels intended for the transmission and reception slots, a second or dedicated frequency synthesizer 2 used for synchronizing the frequencies when the electric field level of other channel is monitored and information is read out of the idle slot other than the transmission and reception slots, a reference frequency oscillator 16 common to the frequency synthesizers 1 and 2 and a selecting means such as a switch 3 for selecting one of the outputs from the frequency synthesizers 1 and 2.

The first frequency synthesizer 1 for transmission and reception comprises a voltage control oscillator 6, a buffer amplifier 8, a variable frequency divider 10 for changing the frequency divider ratio according to the channel designating data 4 of the communication channel, a phase comparator 12 for comparing a reference frequency from the reference frequency oscillator 16 and the output frequency of the frequency divider 10 and charge pump 14, LPF 17 for emitting a converted voltage corresponding to the resulting phase difference to change the oscillating frequency of the voltage control oscillator 6.

The second frequency synthesizer 2 dedicated to monitoring other stations comprises a voltage control oscillator 7, a buffer amplifier 9, a variable frequency divider 11 for changing the frequency dividing ratio according to the channel designating data 5 of the other station to be monitored, a phase comparator 13 for comparing in phase the reference frequency from the reference frequency oscillator 16, which is shared with the transmission/reception frequency synthesizer 1, and the output frequency of the frequency divider 11 and charge pump 15, LPF 18 for emitting a voltage corresponding to the phase difference to change the frequency.

The operation of the local oscillating frequency synthesizer will be described.

In the state that the communication channel is set, with the switch 3 for switching the frequency synthesizer set at the shown position, the transmission and reception frequency are synchronized by the transmission/reception synthesizer 1. The frequency dividing ratio is changed at the variable frequency divider 10 according to the channel designating data 4 of the communication channel, and its phase is compared with that of the reference frequency supplied from the reference frequency oscillator 16 by the phase comparator 12. Therefore, the output frequency of the voltage control oscillator 6 is divided by the variable frequency divider 10 at the dividing ratio according to the channel designating data 4, and the output frequency of the synthesizer 1 is settled when the frequency of the output of the variable frequency divider 10 becomes equal to that of the reference frequency oscillator 16.

Figure 1:
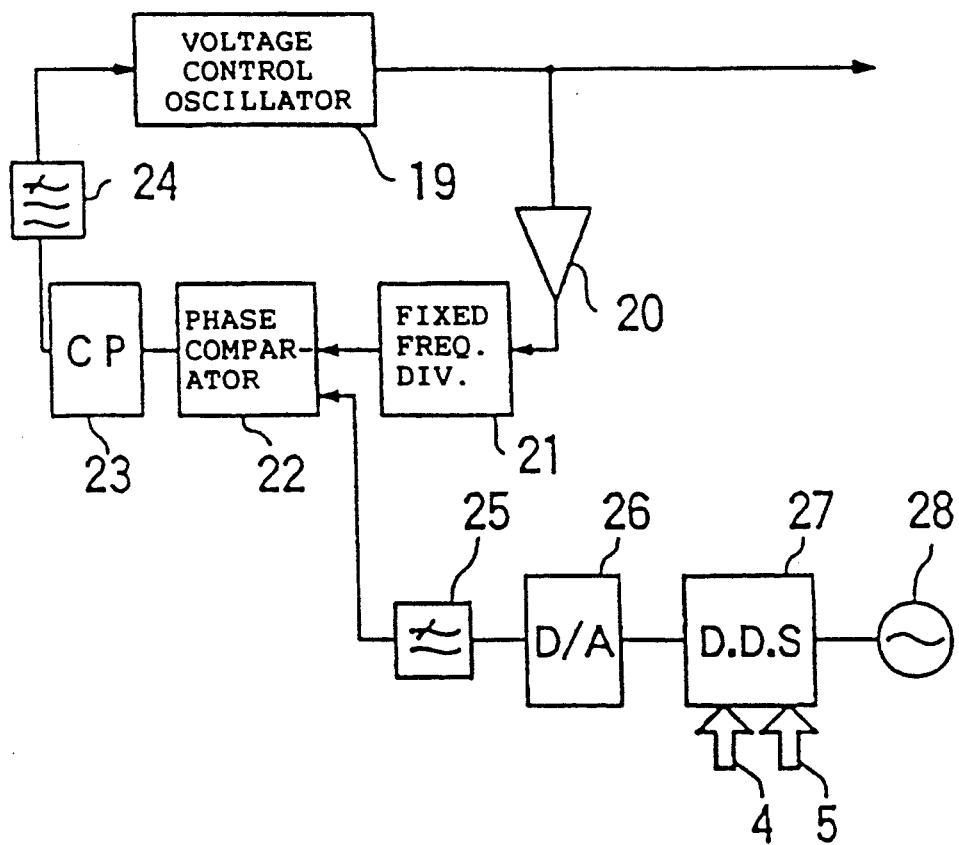
FIG. 1 is a block diagram of a synthesizer using a conventional direct digital synthesizer.
Figure 2:
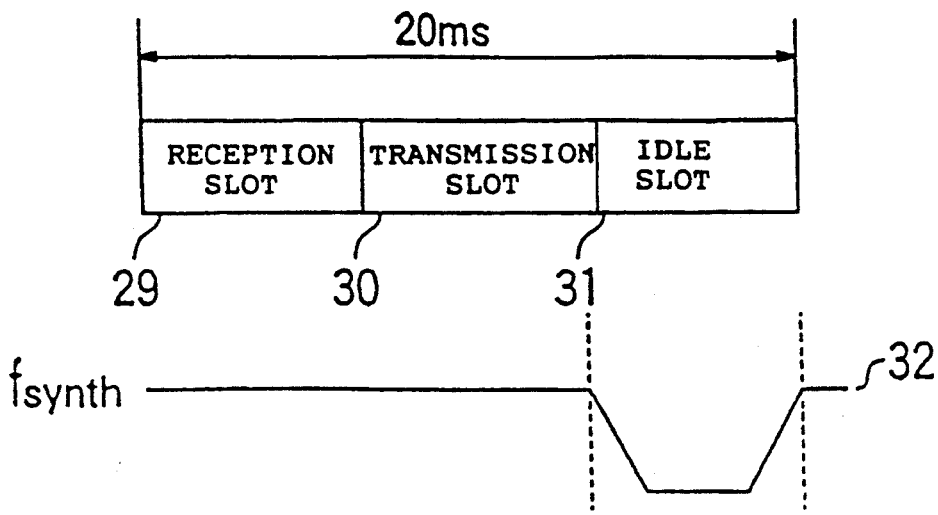
FIG. 2 is a layout plan of slots in the TDMA system.

Upon reception of channel designating data from the base station, if the electric field level of the other adjacent station is monitored and its information is read out, then the switch 3 is switched to the synthesizer 2 dedicated to monitoring the other station to change the frequency dividing ratio by the variable frequency divider 11 according to the channel designating data 5 of the other station at the timing of the local oscillator for the idle slot of FIG. 2. In accordance with the operation similar to that of the transmission/reception synthesizer 1 during the idol slot, the output frequency of the frequency divider 11 is compared in phase with the reference frequency of the reference frequency oscillator 16 by the phase comparator 13 to to synchronously lock the frequencies, and at the next transmission reception slot, the output of the synthesizer 2 is switched to that of the synthesizer 1 by using switch 3.

According to the embodiment as described above, since the frequency synthesizer dedicated to monitoring the other station is adopted, it becomes unnecessary to use the digital frequency generating portion, and the changing step of the voltage control oscillator can be taken small by the variable frequency dividing system. Therefore, the range can be enlarged, and the margin corresponding to a high frequency channel can also be secured to allow a high speed switching of the frequency, and the sharing of the reference frequency generator by the frequency synthesizers 1, 2 also allows a stability of the circuit operation to be assured.

What is claimed is:

1. A local oscillating frequency synthesizer for use in a TDMA system comprising:
    a first frequency synthesizer for synchronizing the frequencies of the communication channels used for transmission and reception slots;
    a second frequency synthesizer sharing a reference frequency oscillator with said first frequency synthesizer, for synchronizing the frequencies when the electric field level of a channel other than said communication channels is monitored and its information is read out of an idle slot other than said transmission and reception slots; and
    a selector means for selecting one of the outputs from said first and second frequency synthesizer.

2. The local oscillating frequency synthesizer according to claim 1 wherein said first frequency synthesizer comprises a variable frequency divider of which frequency dividing ratio is changed according to the channel designation data of the communication channel, and a phase comparator for comparing the reference frequency from said frequency divider with the reference frequency from a reference frequency oscillator.

3. The local oscillating frequency synthesizer according to claim 1 wherein said second frequency synthesizer comprises a voltage control oscillator, a buffer amplifier, a variable frequency divider for changing the frequency dividing ratio according to the channel designation data of the other station to be monitored, a phase comparator for comparing in phase the reference frequency from said reference frequency oscillator and the frequency of said voltage control oscillator, a charge pump, and a low pass filter for emitting a voltage corresponding to the phase difference to change the frequency.

* * * * *